United States Patent
Torelli et al.

(10) Patent No.: US 6,366,496 B1
(45) Date of Patent: Apr. 2, 2002

(54) METHOD FOR PROGRAMMING MULTI-LEVEL NON-VOLATILE MEMORIES BY CONTROLLING THE GATE VOLTAGE

(75) Inventors: Guido Torelli, Sant'Alessio Con Vialone; Alberto Modelli, Milan; Alessandro Manstretta, Broni, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/631,187

(22) Filed: Aug. 2, 2000

(30) Foreign Application Priority Data

Aug. 3, 1999 (EP) .............................. 99830501

(51) Int. Cl.$^7$ .............................................. G11C 11/34
(52) U.S. Cl. .............................. 365/185.19; 365/185.22
(58) Field of Search ....................... 365/185.19, 185.22, 365/185.18, 185.2

(56) References Cited

U.S. PATENT DOCUMENTS

| 5,768,191 A | | 6/1998 | Choi et al. ............. 365/185.22 |
| 5,774,397 A | * | 6/1998 | Endoh .................... 365/185.19 |
| 5,867,427 A | | 2/1999 | Sato ........................ 365/185.2 |
| 5,870,334 A | * | 2/1999 | Hemink ................. 365/185.17 |
| 6,011,715 A | * | 1/2000 | Pasotti ................... 365/185.03 |

FOREIGN PATENT DOCUMENTS

WO    WO 97/48099    12/1997

OTHER PUBLICATIONS

Lanzoni M. et al., "A Novel Approach to Controlled Programming of Tunnel–Based Floating–Gate Mosfet's," IEEE Journal of Solid–State Circuits. vol. 29, No. 2, 1994, pp. 147–150.

Yamashita Y.et al., "Write/Verify Free Analog Non–Volatile Memory Using a Neuron–Mos Comparator." IEEE International Symposium on Circuits and Systems, 1996, pp. 229–232.

Shen S. et al., "Novel Self–Convergent Programming Scheme for Multi–Level P–Channel Flash Memory." International Electron Devices Meeting, 1997 pp. 287–288.

* cited by examiner

Primary Examiner—A. Zarabian
(74) Attorney, Agent, or Firm—Lisa K. Jorgenson; David V. Carlson; Seed IP Law Group PLLC

(57) ABSTRACT

When programming, for each programming pulse, a threshold voltage whose value is increased with respect to the previous programming pulse is applied to the gate terminal of each cell to be programmed. After an initial step, the increase of threshold voltage of the cell being programmed becomes equal to the applied gate voltage increase. In order to reduce the global programming time, keeping a small variability interval of threshold voltages associated with each level, to pass from a threshold level to a following one, each cell to be programmed is supplied with a plurality of consecutive pulses without verify, until it is immediately below the voltage level to be programmed, and then a verify step is performed, followed by subsequent programming and verify steps until the cell to be programmed reaches the desired threshold value.

19 Claims, 7 Drawing Sheets

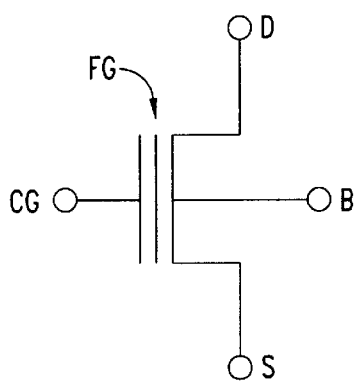
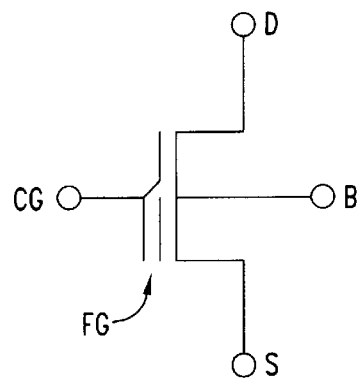
Fig. 1A
*(Prior Art)*
Fig. 1B
*(Prior Art)*
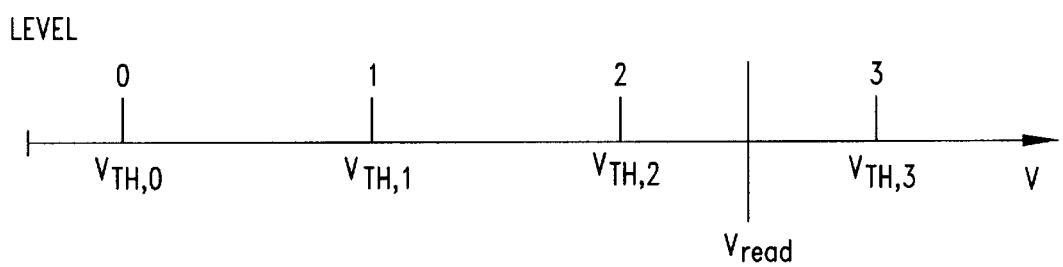
Fig. 2A
*(Prior Art)*
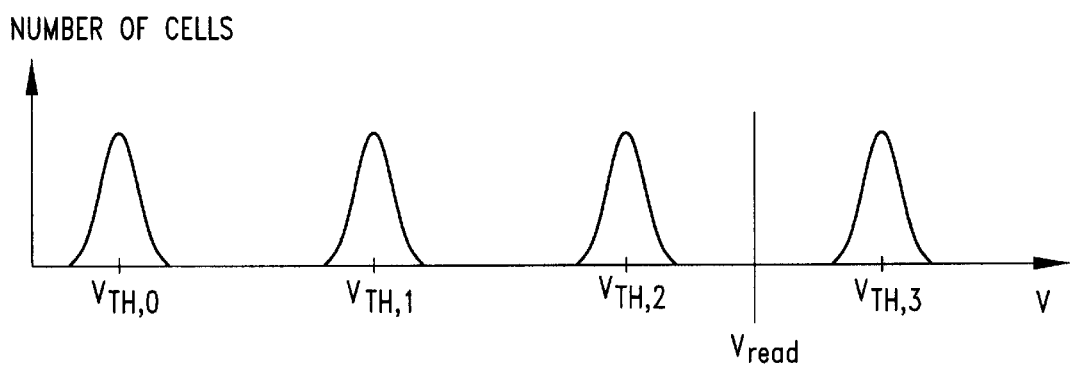
Fig. 2B
*(Prior Art)*

METHOD FOR PROGRAMMING MULTI-LEVEL NON-VOLATILE MEMORIES BY CONTROLLING THE GATE VOLTAGE

TECHNICAL FIELD

The present invention relates a method for programming multi-level non-volatile memories by controlling the gate voltage. The invention specifically refers to non-volatile memories formed of floating gate cells (EPROM, EEPROM, flash) in which the cells programming is performed by modifying the threshold voltage of the cells, that is modifying the amount of the charge stored in the floating gate region. The present method however can be applied also to memory cells of a different type (for example MNOS, i.e., Metal-Nitride-Oxide-Semiconductor technology cells).

BACKGROUND OF THE INVENTION

For a better understanding, FIG. 1 shows the electric diagram of a typical floating gate memory cell having a drain terminal D, a source terminal S, a control gate terminal (herein below also defined gate terminal) CG and a body terminal B. FIG. 1 further shows the floating gate region FG. FIG. 2 shows the symbol of a different memory cell, the so called "split-gate".

Currently, to increase the data storage density and therefore reduce the physical memories array sizes, multi-level programming techniques are being studied, wherein the threshold voltage for each memory cell can be programmed to one among m predetermined levels. If $m=2^n$, a memory cells is able to store a number of information bits equal to $n=\log_2 m$, with clear advantages in terms of density with respect to conventional two level memories, allowing programming of two levels only ("high" level and "low" level), and therefore storing a single bit per cell (m=2 and therefor n=1).

The programmable threshold levels must be placed to a certain mutual distance, in order to be able to be recognized without errors when read. Moreover, the threshold voltage cannot be programmed exactly at the desired value: every level corresponds in practice to certain threshold voltage interval, as shown by the comparison between FIG. 2a and FIG. 2b related to four-level programmable cells. FIG. 2a shows the ideal case in which it is supposed to obtain a precise programming of each of four threshold voltage levels, while FIG. 2b shows a more realistic case, in which every logic value corresponds to a certain threshold voltage interval. FIG. 2a also shows the correspondence assigned, as an exemplificative but non limiting example, between the different threshold voltage values and programmed levels (respectively 0, 1, 2 and 3).

The threshold voltage interval corresponding to each programmable level must be sufficiently reduced so that the intervals corresponding to adjacent levels can be placed at such a mutual distance as to guarantee safe maintaining and recognizing of data stored into the cells, without having to use a global interval excessively wide to allocate all desired logic levels. In fact, there are both a lower limit and an upper limit for this global interval, dictated by practical reasons and reliability reasons. In order to compute the optimum distance between threshold voltage intervals corresponding to different stored levels, effects such as reading and programming circuits inaccuracy and environmental conditions variations, degrading time of the stored charge and reading and programming noises must also be taken into account, since they create an undesired stored charge variation, as known to the skilled person.

To obtain an adequate cell programming, generally the multi-level cell programming is performed through the technique defined as "program and verify". According to this technique, a programming operation is performed through a succession of programming pulses and, after having applied each programming pulse, it is verified whether the programmed cell threshold voltages reached the respective desired value, as schematically shown in FIG. 3: if a certain cell has reached the desired threshold level, it does not receive any further programming pulses. Verifying is usually performed simultaneously for all cells in a group of cells (one or more words) that are programmed in parallel and for any desired programming level, it consists in comparing, directly or indirectly, a cell threshold voltage with preset reference values $V_{ref,i}$. Programming and verifying continue until all cells in a group have been programmed at the respective desired level.

It has been demonstrated (see for example: "Technological and design constraints for multilevel flash memories" by C. Calligaro, A. Manstretta, A. Modelli, G. Torelli, Proceedings of Internal Conference on Electronic Circuits and Systems, Rhodes, Greece, pp. 1003–1008) that if a set of programming pulses with constant time length is applied to a non-volatile memory cell, the drain terminal voltage is kept constant and the gate terminal voltage is increased by a constant value $\Delta V_{GP}$ at every pulse (stepped gate voltage), after a first transient step (lasting, generally, few pulses if during the first pulse an adequate voltage supplied to the gate terminal), the cell threshold voltage is subjected to an increase $\Delta V_{TH}$ equal to $\Delta V_{GP}$ for every pulse. Thus, after the initial transient step, we have:

$$\Delta V_{TH} = \Delta V_{GP} \quad (1)$$

This relationship is valid if the programming pulse has a time length greater than a minimum value that depends on the type of process and cell and that for typical cells can be included between some hundreds of ns and 1 µs.

Relationship (1) is valid for any cell, but the relationship between the voltage value applied to the cell gate terminal during the last programming pulse, and the threshold voltage value $V_{TH}$ reached by the cell at the end of such pulse cannot be determined a priori for a specific cell. In other words, relationship (1) shows the threshold voltage increase upon every programming pulse, but not its absolute value. Such absolute value in fact depends on different factors linked to the manufacturing process (for programmable cells through hot channel electron injection, for example, it depends firstly on the effective cell channel length).

This is schematically shown in FIG. 4, that shows the behavior of the threshold voltage Vth obtained by representing along the ordinate the threshold voltage after applying each programming pulse N (shown along the abscissa) and connecting the points thereby obtained, for three different cells (in particular, curves A, B, and C refer to cells having respectively increasing channel lengths). As can be noted, after a first initial step, the threshold voltage increases linearly, with increments $\Delta V_{GP}$ upon every programming pulse, along three mutually parallel straight lines. In practice, from relationship (1) it is not possible to know on which of the three straight lines the threshold voltage of a specific cell is moving during programming and therefore is not possible to compute the absolute threshold voltage value Vth reached after each pulse.

By applying such principles to the programming and verifying technique, the memory cells are programmed by applying programming pulses with a constant length, constant drain voltage, and progressively increasing gate voltage with a constant increase equal to $\Delta V_{GP}$ between two subsequent pulses. Therefore the gate terminal voltage plot as shown in FIG. 5 is obtained. Under ideal conditions, with this technique the width of the intervals corresponding to programmed levels (hereinbelow called program level width) is equal to $\Delta_{GP}$. In fact, during programming, the (j−1)-th programming pulse, preceding the one in which the threshold voltage corresponding to the desired programming level (i-th level) is reached and whose comparison reference level during verifying is equal to $V_{ref,i}$, determines a threshold voltage that is less than $V_{ref,i}$ but next to this one, while when j-th programming pulse is provided, the threshold voltage goes to a value equal to the previous value plus $\Delta V_{GP}$, so that it will not be greater than $V_{ref,i}+\Delta V_{GP}$. In practice, the threshold voltage for the program cells at level $V_{TH,i}$ exceeds the reference value $V_{ref,i}$, by an amount included between 0 and $\Delta V_{GP}$.

Consequently, though there are other effects causing widening of the programmed levels, such as for example inaccuracy of the reading circuits used during verify, generally a reduction in the increase $\Delta V_{GP}$ of the programming voltage applied to the cell gate terminal brings about a decrease in the width of the programming levels, allowing to better allocate the levels themselves within the predefined interval as mentioned above.

On the other hand, the reduction in the increase $\Delta V_{GP}$ requires a corresponding increase of the number of programming and verifying pulses necessary to reach a preset final threshold voltage starting from a predetermined initial value.

The increase of the number of programming and verifying pulses generates an increase of the global time necessary to program a memory cell at a preset threshold level. In fact, the time necessary for a complete programming and verifying step is decisely greater than the time for a single programming pulse, above all in the case of short time programming pulses (1 μs or less). Between each programming pulse and the following verifing step, in fact, it is necessary to deactivate the programming circuitry, activate the reading circuitry inside the integrated circuit and wait for the reading voltages to be applied to cells to reach the desired value with a sufficient accuracy, which requires a certain length of time. Moreover the accuracy required for bias voltages increases along with a decrease in the distance between threshold voltages corresponding to adjacent programmed levels (the cell current when reading, and, therefore, when verifying strictly depends on the value of voltages applied to drain and gate terminals).

Similarly, when a verifying step is followed by a programming step, it is necessary to deactivate the reading circuitry and to activate the programming circuitry with a further loss of time. The time for a complete programming and verifying step is therefore equal to $T_{GP}(1+\eta)$, wherein $T_{GP}$ is the length of a programming pulse and η is greater than 0 and generally can be of the order of one.

Depending on specific needs, it is therefore necessary to perform a compromise choice between programmed level accuracy (low increase $\Delta V_{GP}$ and therefore high number of complete programming and verifying steps) and the global programming operation speed.

SUMMARY OF THE INVENTION

According to principles of the present invention, a programming method for non-volatile memory cells is provided. A complete programming operation is carried out with a plurality of programming pulses not followed by a verify step. Only after a plurality of pulses have been applied is the first verify performed to determine the programmed level. This allows an improvement in the compromise between accuracy and global programming time.

BRIEF DESCRIPTION OF THE DRAWINGS

For a better understanding of the present invention, some preferred embodiments thereof will now be described, purely as a non limiting example, with referenced the attached drawings wherein:

FIGS. 1a and 1b show two electric symbols for floating-gate memory cells;

FIG. 2a shows the relationship between different threshold values and respective programming values;

FIG. 2b shows the distribution associated with the threshold values in FIG. 2a;

DETAILED DESCRIPTION OF THE INVENTIONS

To solve the problem of reducing the global programming time and having a sufficient accuracy of programmed levels, the interval between nominal values of two following levels is divided into a plurality of intervals whose width is equal to the gate voltage increase applied during programming, plus eventually a interval whose width is less than the increase. It is not mandatory that the interval between levels is constant or that it is an exact integer multiple of applied gate voltage increments $\Delta V_{GP}$. Programming is then performed by applying a plurality of programming pulses equal to the plurality of preset increments, without performing intermediate verify steps and the reached threshold voltage verify is performed only after the plurality of programming steps have been performed, when the reached threshold voltage is presumably equal or slightly greater than the minimum desired threshold voltage for the considered level for at least one of the cells being programmed. To be prudent, verifying can be carried out after the programming pulse that, presumably, is immediately preceding the desired threshold voltage being reached, corresponding to the provided programming level.

In practice, the programmed levels configuration and the increment value $\Delta V_{GP}$ are such that the level widening due to the increment with $\Delta V_{GP}$ is much less than the distance between nominal values of the levels. For example to go from a programming level to another, 7 programming steps are performed. Such configuration is advantageously used in case of memories with many programmable levels per cell, in which a high programmed level accuracy is desired in order to allocate adequate separation gaps between adjacent programmable levels to take into account the existing uncertainty conditions.

Figure 6:
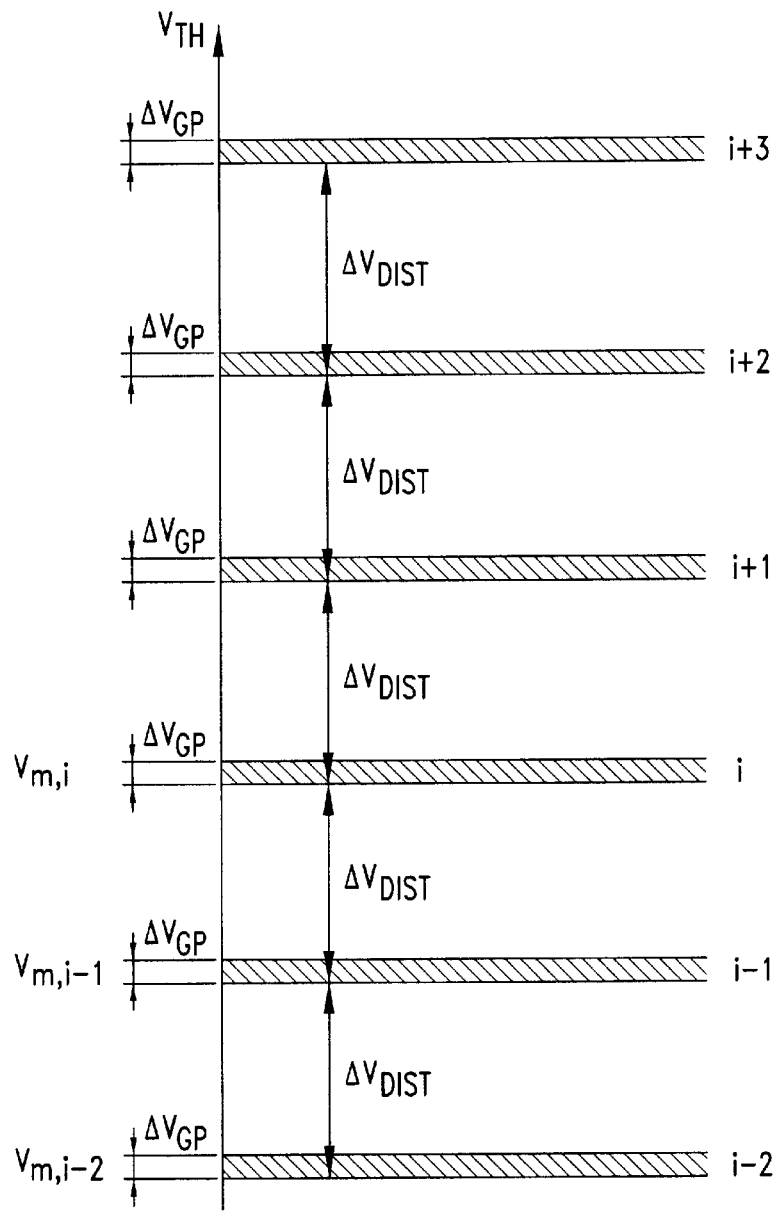
FIG. 6 shows a diagram of threshold voltage intervals associated with different programming levels.

Such configuration is shown in FIG. 6, in which the distance between nominal values of following levels is denoted $\Delta V_{DIST}$ and the level widening $\Delta V_{GP}$. In the Figure it has been assumed for an easy understanding (but not in a limiting way) that the same distance $\Delta V_{DIST}$ is always present between nominal values of different levels. The term $\Delta V_{DIST}$ as a function of $\Delta_{VGP}$ can be expressed as:

$$\Delta V_{DIST} = C \Delta V_{GP} = (N+\alpha) \Delta V_{GP} \qquad (2)$$

where $C = \Delta V_{DIST} / \Delta VGP$, N is the integer value obtained by truncating C and $\alpha$ is equal to the resulting decimal value, with $0 \leq \alpha < 1$, in which $\alpha$ is equal to 0 only when the distance between following levels is an exact multiple of the programming step. For example if $\Delta V_{DIST} = 1V$ and $\Delta V_{GP} = 0.14$ V, $\alpha = 0.02$.

To program a memory cell from level i to level i+1, supposing to be already in the characteristics area in which the linear relationships between $\Delta V_{TH}$ and $\Delta V_{GP}$ is valid, according to (2) it is necessary to apply N or N+1 programming pulses, depending on whether the previously reached effective voltage, related to the i-th level, is greater or lower than $V_{m,i} + \alpha \Delta V_{GP}$ in which $V_{m,i}$ is the minimum value of the $i^{th}$ level (that is, ideally, the reference level value $V_{ref,i}$). Specifically, in the above considered example, if $V_{m,1} = 1$ V, $V_{m,2} = 2$ V and $V_{m,3} = 3$ V, supposing that the reached threshold voltage for level "1" is equal to the nominal 1 V, to pass from level "1" to level "2" N+1=8 pulses are necessary, after that the effective reached threshold voltage would be equal to 2.12 V, while to pass from this value of level "2" to level "3" 7 pulses are necessary, and then the effective threshold voltage being reached would be equal to 3.1 V.

Consequently, in order to take the threshold voltage of a cell from level i to level i+1, N−1 programming pulses are applied with an increasing gate voltage, with increment $\Delta V_{GP}$, without carrying out any verify after each pulse; in this way one is sure that the cell cannot still have reached the level (i+1)-th. Then, a further pulse (N-th) is applied with a gate voltage increment $\Delta V_{GP}$, and verify is performed. If the threshold voltage has not yet been reached, a further pulse ((N+1)-th) is applied with a still increased gate voltage by the provided increase, eventually followed by a further verify step, even if this one is not strictly necessary, since the threshold voltage now must have already reached level (i+1)-th.

Figure 5:
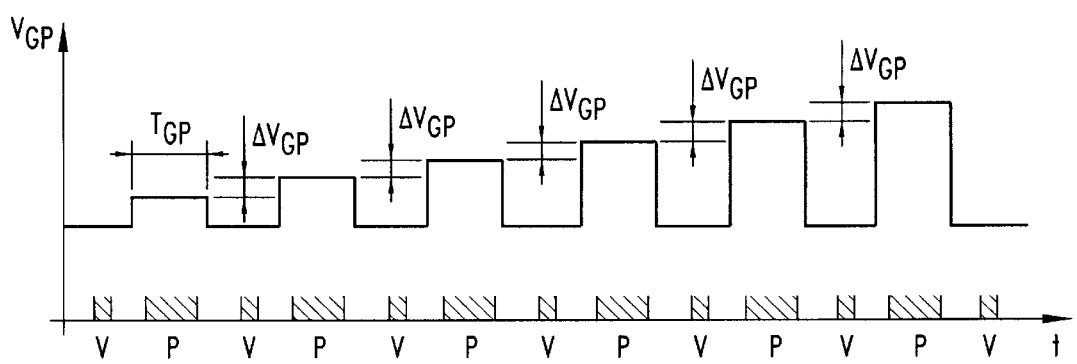
FIG. 5 shows the behavior of the gate voltage applied during following programming and verifying steps.
Figure 7:
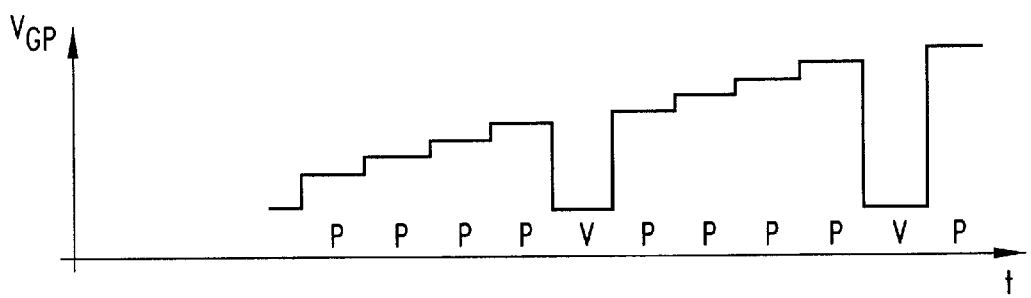
FIG. 7 shows the plot of the gate voltage applied during following steps according to the present method.

Such arrangement is shown as an example in FIG. 7 that shows the plot of the gate voltage during programming of a cell according to the invention, supposing that N is equal to 4 and that the verify step immediately provides positive result. FIG. 7 must be compared with FIG. 5 and shows how, with the invention, it is possible to apply a greater number of programming impulses with a same global time.

In this way, a high time advantage is obtained with respect to the known solution of performing a verify step for every programming step. In fact, in case N programming steps are required to pass from a program value to the following one, the known solution requires a timing equal to $N(1+\eta)T_{GP}$ while the present solution requires a time equal to $(N+\eta)T_{GP}$, with a time saving equal to $(N-1)\eta T_{GP}$. If instead, N+1 programming steps are necessary, the necessary time will be equal to $(N+1+2\eta)T_{GP}$ or $(N+1+\eta)T_{GP}$ depending on whether the last programming step for each level is followed, or not, by a verify step, with time saving respectively equal to $(N-1)T_{GP}$ or $N\eta T_{GP}$.

If a cell threshold voltage must be taken from a generic level i to a level i+j, with j>1, it is possible both to program the cell every time to the following level i+1, i+2, . . . until level i+j is reached by verifying every time that the single intermediate levels are reached, or to apply Z−1 pulses, where Z is the integer number obtained by truncating number $j(N+\alpha)$, then perform a complete programming and verify step, and if the cell has not yet reached the desired level, apply a last programming pulse (with or without final verify similarly to what has been previously stated).

Figure 3:
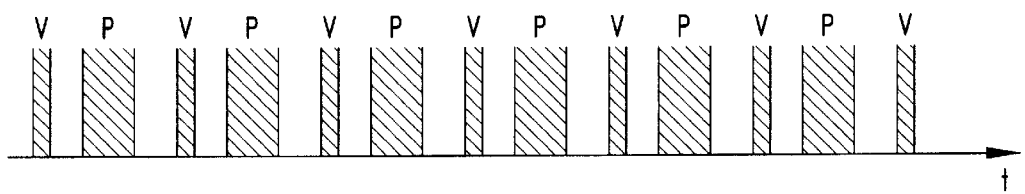
FIG. 3 shows a sequence of programming and verifying pulses.
Figure 4:
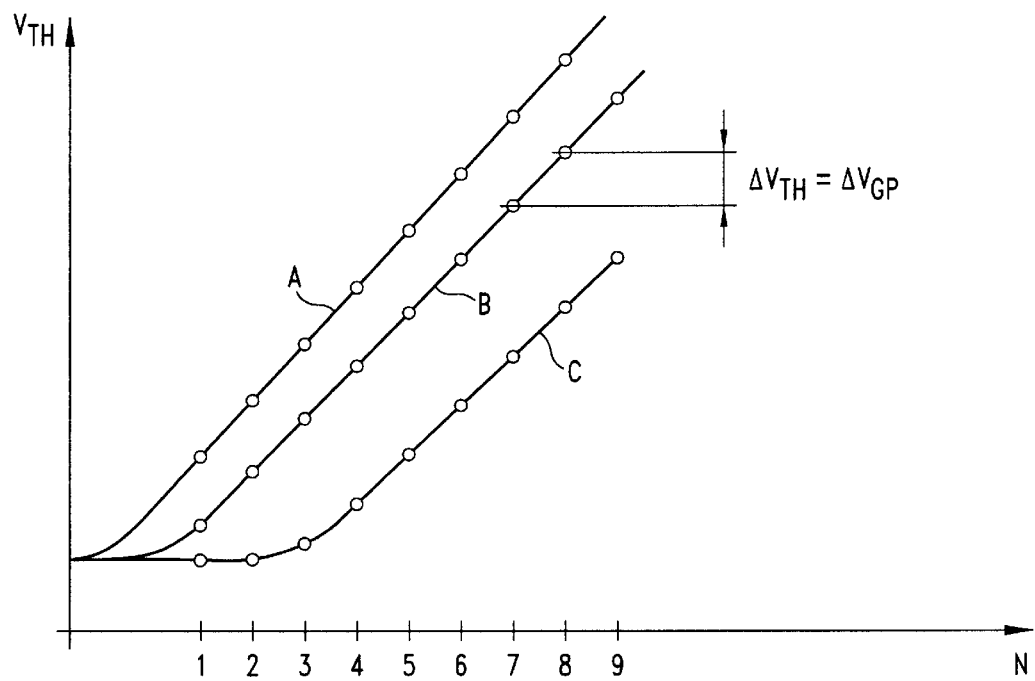
FIG. 4 shows a plot of the threshold voltage modification in a programming mode.

In order to reach the first programmed level, (level 1) starting from the erased level, it is necessary to supply the cell with a number of programming pulses that is not known a priori, since the threshold voltage from which relationship (1) is valid is not known, that is it is not known on which of the straight lines shown in FIG. 4 the involved cell is moving. It is therefore necessary to perform a verifying step after every programming step, until the threshold voltage corresponding to level 1 is reached, thereafter it is possible to follow the above-mentioned solution (provided that the programming conditions are such that level 1 is reached when the cell already operates in the region in which the linear relationship (1) is valid).

In case programming is performed in parallel on a group of cells (for example 8 or 16, belonging to the same array line) starting from the minimum threshold state (or erased state) programming pulses are simultaneously applied in the above described way to the cells that must be programmed at a different level from the minimum threshold level. When a cell has reached the desired programming level, it does not receive any more programming pulses (such interruption is obtained in a known way: for example the related bit line, connected to the drain terminal is not biased any more at the programming voltage), and programming goes on for the other cells, until they are all programmed at the provided level. Obviously, no programming pulses are ever applied to the cells that must remain in the erased state.

In case of cells to be programmed belonging to the same line, they show a good physical matching level, so that generally the threshold voltage value at which relationship (1) starts to be valid is similar and there are no problems in applying the described method.

In practice, the cells that must be programmed are supplied with a set of programming pulses each followed by a verify step, until the threshold voltage of at least one of the cells reaches the value corresponding to the first level. A number Al of programming pulses is then supplied, each followed by a verify step, until all cells to be programmed have a threshold voltage corresponding to level "1" ($A_1$ cannot be determined a priori). Obviously, the cells that must be programmed at level "1" do not receive programming pulses after their threshold voltage has reached the desired value.

Afterwards all the cells that must be programmed at levels greater than 1, receive $N-(1+A_1)=N-1-A_1$ pulses without verify (no cell, in fact, is programmed at level 2 after these pulses). Then further pulses are provided, each one followed by a verify step, until the threshold voltage of at least one cell reaches the second level, after which other $A_2$ programming pulses are provided followed by verify, until the threshold voltage of all the cells to be programmed at least at a second level has reached the desired value.

The procedure is repeated, so that, to reach level i+1, $N-A_i-1$ programming pulses are applied each time without verify, followed by an adequate number of programming pulses with verify until at least one cell has reached level (i+1)-th, and by $A_i+1$ pulses with verify, until all cells to be programmed at least to level i+1 have reached this level, and going on until all cells have been programmed at the provided level.

In such way, with respect to the solution in which all programming pulses are followed by a verify step, $N-1-A_i$ verify steps are saved for each level. Consequently, globally, the saved time is equal to:

$$\sum_{2}^{m-1}(N-1-A_i)\eta T_{GP}$$

In case the distance between adjacent levels $\Delta V_{DIST}$ to be programmed is not constant, the operation is exactly as above described apart from the fact that the $N_i$ value to be inserted in formula $(N_i-A_i-1)$ that provides the number of pulses to be applied is not constant but changes according to levels.

The programming method according to the invention will now be described more in detail according to FIG. 8 that shows the flow-chart of a possible implementation. In such description, it is supposed that programming is performed on an initially erased group of cells, as is common in electrically programmed non-volatile memories.

Initially, a verify step is performed, block 100; then a level counter i, associated with the level to be programmed, is set to zero (block 101), together with a pulse counter K, relative to programming pulses (block 102).

Then it is verified whether there are cells to be programmed at a level greater than the i-th (condition "ANY>i", block 103). If the result is negative, the programming procedure ends, if it is positive (output YES from block 103) the level counter i is increased, block 104, and the number of programming pulses $N_i$ that are theoretically necessary to program a cell from level i-1 to level i is determined, block 105. Detecting is preferably performed by reading $N_i$ from a stored table; in case i=1, $N_i$ is equal to 1, in order to perform verifying after every programming pulse as explained below.

Afterwards, block 106, $B_i$ (number of pulses to be consecutively applied) is set equal to $N_i$.

Then, block 120, application of the programming pulse to the cell or the cells that must not be programmed is stopped; block 107, pulse counter k is increased; block 108, a programming pulse is applied, in the above described way, that is starting, for the gate voltage $V_{GP}$, from a starting value at the first programming pulse (i=1) and increasing it at every step by $\Delta V_{GP}$ with respect to the previous step; and it is then verified whether $N_i$ programming pulses have already been applied, block 109; in the negative, output NO, the pulse counter k is again increased, going back to block 107 and proceeding as stated above, in the positive (output YES from block 109, as occurs immediately after having applied the first programming pulse in case of i=1), the verify step is performed, block 110. Then, it is verified whether the threshold voltage of at least one cell has reached level i-th block 111, corresponding to the condition "ONEi"=1; in the negative a new programming pulse is applied, block 112; in the positive (output YES from a block 111), the pulse counter k is reset, block 113, and it is verified whether the threshold voltage of all the cells to be programmed at a level $\geq i$ has reached the value corresponding to level i-th, block 114 corresponding to the verify of condition "ALLi"=1.

If the result is positive (output YES from block 114), a return is made to block 103, verifying whether programming of all cells to be programmed is ended; in the negative (output NO, application of further programming pulses to cell or cells that must be programmed at level i-th is stopped, since they have already reached such level, block 115; the pulse counter k is increased, block 116; a programming pulse is applied, block 117; a verify step is performed, block 118; and it is again verified whether the threshold voltage for all cells to be programmed at a level $\geq i$ has reached the value corresponding to level i-th, going back to block 114.

Figure 8:
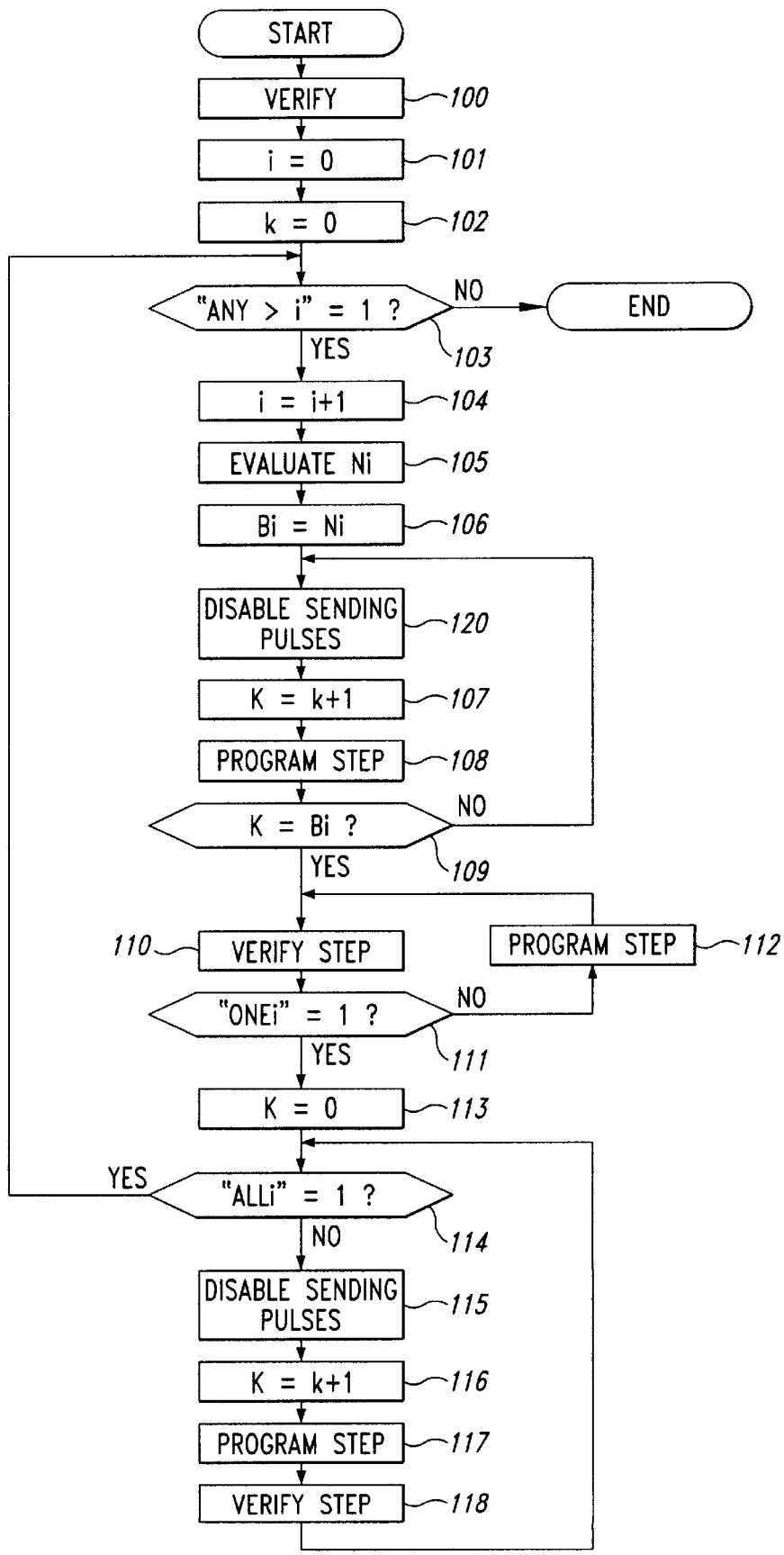
FIG. 8 shows a flow-chart of a first embodiment of the present method.
Figure 9A:
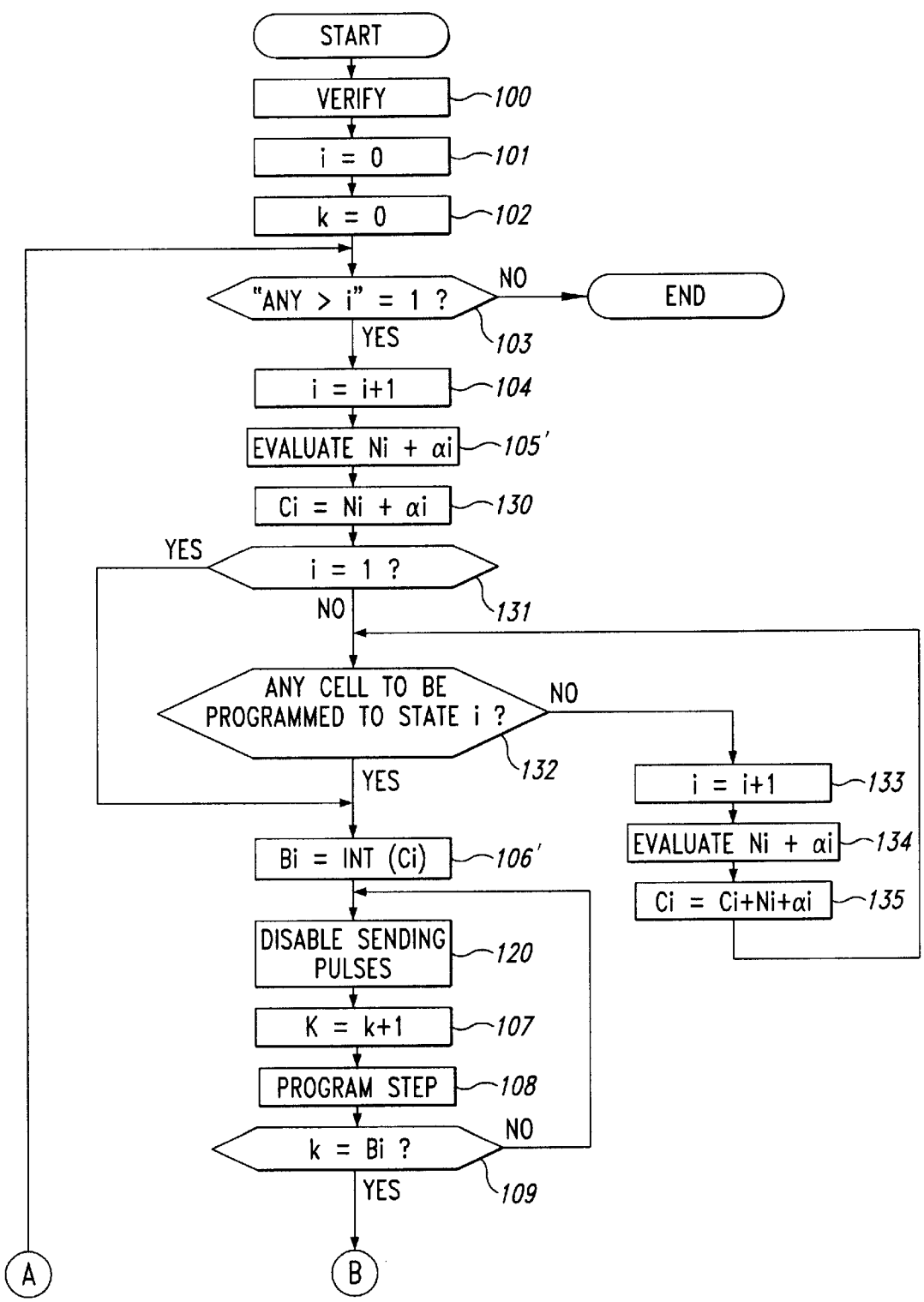
FIG. 9 shows a flow-chart of second embodiment of the present method.
Figure 9B:
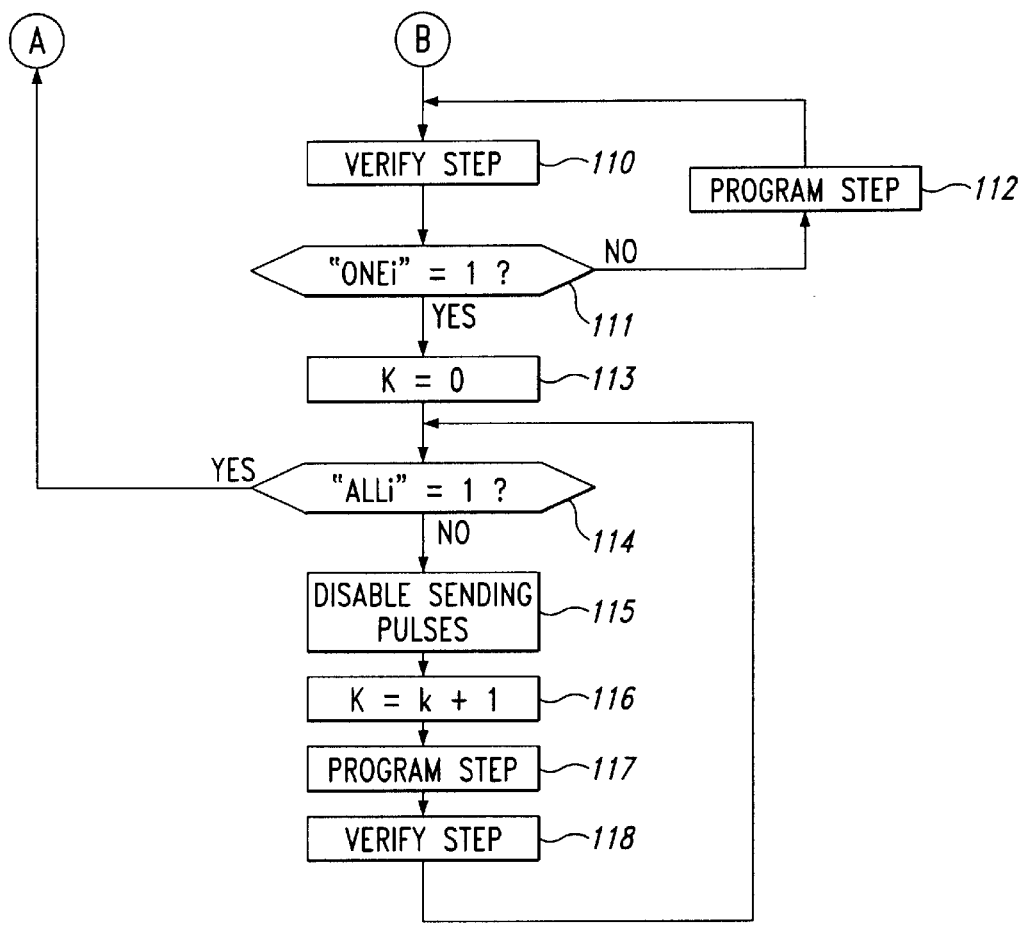

FIG. 9 shows a variation of the flow-chart of FIG. 8, in which no verify of intermediate levels for which there are no cells to be programmed, is carried out.

Consequently, the steps equal in FIGS. 8 and 9 have been designed with the same reference numbers, and in FIG. 9 the steps similar to those in FIG. 8 have been designed with the same number followed by a prime.

Specifically after block 104, in which level counter i of levels to be programmed is increased, in block 105' the number of pulses $N_i$ and the truncation $\alpha_i$ are detected, obtained according to (2) for the i-th level. Then, block 130, a number $C_i$ is computed that is equal to the ratio between $\Delta V_{DIST,I}$ and $\Delta V_{GP}$ for the i-th level, by adding $N_i$ and $\alpha_i$. Then it is verified whether i=1 and if so (output YES from block 131) number $B_i$ of programming pulses to be consecutively applied is computed, equal to the integer value of $C_i$, block 106'; if not (output NO from block 131), it is verified whether some cells must be programmed at level i-th, block 132; if so (output YES from block 132), $B_i$ is computed, going to block 106'; if not (output NO from block 132) level counter i is increased, block 133; $N_i$ and $\alpha i$ associated to the following level are detected, block 134; and the new value of $C_i$ is computed, equal to the previous value plus the newly detected value $N_i$ and $\alpha_i$; then it is again verified whether at least one cell must be programmed at the (i+1)-th level, going back to block 132.

As for the rest, the flow-chart of FIG. 9 is similar to that of FIG. 8 and therefore it will not be described again.

A further global time saving can be obtained if the minimum number D of pulses necessary to take an erased cell (state 0) to the lower end of the first programming level (state 1) is known a priori. This number can be computed for every die during the Electrical Wafer Sort. In such a case, when programming begins, D pulses without verify steps are initially applied to the cells that must be programmed, and then pulses with verify are applied until at least one of the cells reaches level "1". Programming then proceeds as previously described.

Figure 10:
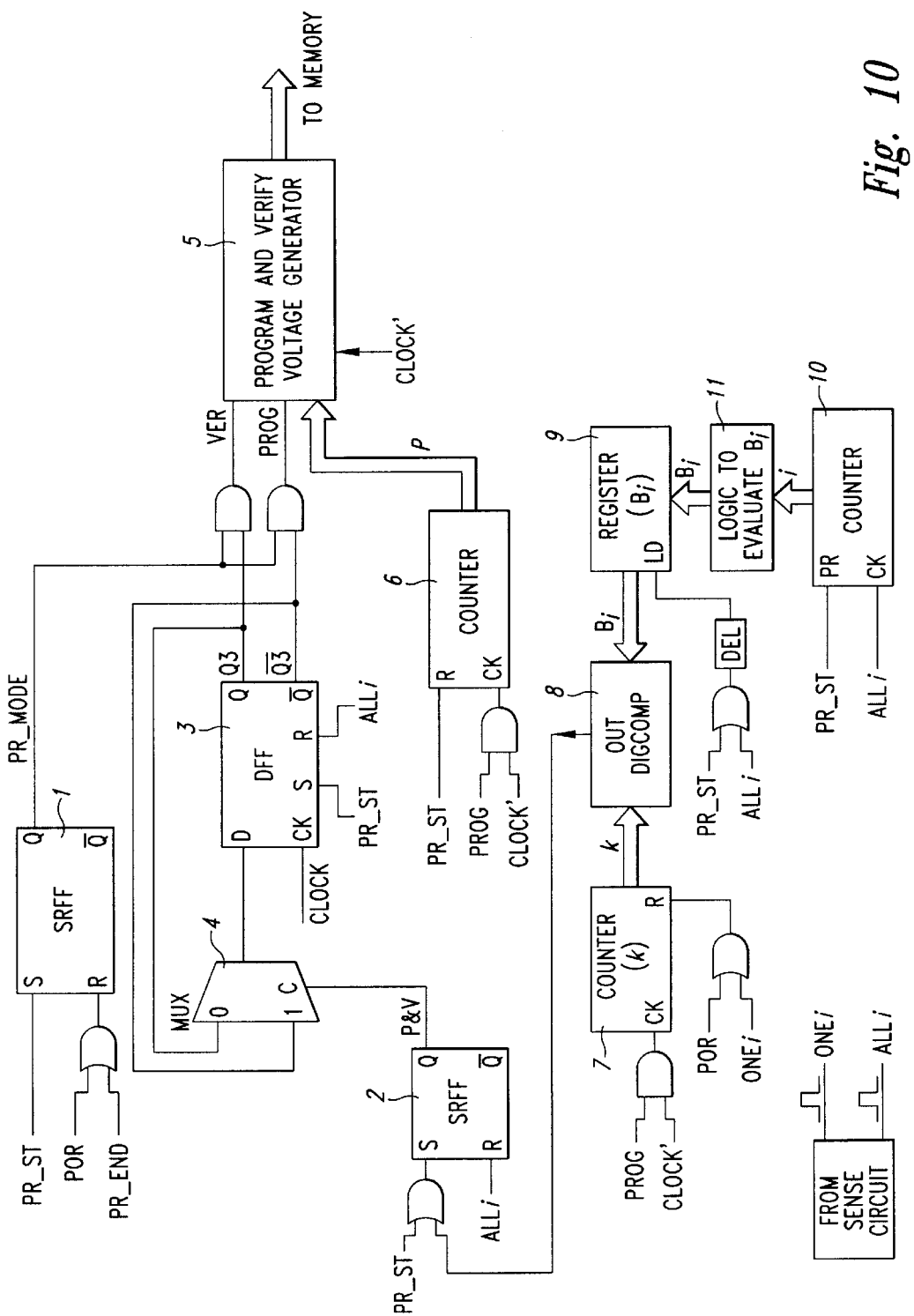
FIG. 10 shows a block diagram of a possible hardware implementation of the method of FIG. 8.

FIG. 10 shows a block diagram of a hardware circuit implementing the method in FIG. 8. The circuit is timed by a signal CLOCK and by a signal CLOCK' delayed with respect to CLOCK.

A programming operation is activated upon receiving a Program Start pulse (PR_ST), synchronous with CLOCK, that sets two flip-flops 1 and 2 taking signal PR_MODE ("Program mode") and signal P&V ("Program&verify") to a high state.

Under operating conditions, as will also be more clear below, the alternate setting of a verify step and a programming step is ensured by the output switching of a delayed flip-flop 3 that switches at every pulse CLOCK if the signal P&V provided to the control input C of multiplexer 4 is at high level, since in this case the input D of the delayed flip-flop 3 receives the signal $\overline{Q3}$ of the delayed flip-flow 3.

At the beginning of a programming operation, the output Q3 of the delayed flip-flop 3 is set to 1 by signal PR_ST in order to perform a verify step.

When the circuit is under "program mode" a high level on output Q3 activates the "verify" (signal VR), while a low level activates the "program" signal PRG. Activation of signal VR or signal PRG allows (block 5) generating suitable signals to be sent to the memory array to respectively perform verify and programming operations, in a per se known manner. Generator 5 receives at the input also signal CLOCK' (used for timing the signals to be sent to the memory array) in addition to the value of the number of programming steps P already performed during the current programming cycle, to set the correct threshold voltage value according to an increasing law, as above described. The value of the global programming steps P is generated by a first counter 6 reset by signal PR_ST at the beginning of a new programming operation.

Signal P&V determines if the circuit must perform a verify step after a programming step. In fact, if P&V has a high value, as stated above, output Q3 switches upon every CLOCK pulse alternatively activating signals VER and signal PROG; vice versa, if P&V has value 0, input D of delay flip-flop 3 coincides with output Q3 and does not switch. Consequently, the circuit is kept under "program" status.

The control signal of multiplexer 4 is generated as follows.

As shown, at the beginning, the flip-flop 2 is set and its output is high. When, after a verify step, the condition "ALLi"=1 is verified (block 114, FIGS. 8 and 9), that is all cells to be programmed at least at level i-th have reached such level, signal ALLi has a pulse resetting the flip-flop 2 switching signal P&V in the low state.

When the circuit is under "program and verify" condition and at least one cell (among those that must be programmed at least at the i-th level) is found that has reached i-th level, a pulse is generated on signal "ONEi" (as described with reference to block 111 in FIGS. 8 and 9) and the contents of a second counter 7, storing the value of step counter k, are reset. The second counter 7 is increased by one unit upon every programming pulse and is compared by a digital comparator 8 receiving the comparison value $B_i$ (number of programming pulses to be consecutively applied) by register 9.

When the digital comparator 8 checks the equality $B_i = k$, it outputs a pulse OUTC setting the flip-flop 2, taking the circuit back under a "Program and Verify" condition (P&V= 1).

A third counter 10 counts the number of levels so far programmed and then provides at the output the value of i. The third counter 10 is initialized at state 1 at the beginning of a programming operation by signal PR_ST and has an output connected to a logic block 11 that provides register 9 with value $B_i$ depending on i.

Loading of $B_i$ is performed at the beginning of the programming cycle related to the i-th level, when the previous cycle ends, as signaled by a pulse on signal ALLi causing the increase of the third counter 10 and the generation of a new value of $B_i$. In the first programming cycle, (i=1), loading of $B_i$ in register 9 is obtained through PR_ST. Block DEL generates a suitable delay in the loading signal.

Flip-flop 1 is reset when the circuit is turned on (signal POR) and at the end of a whole programming operation, when signal PR_END switches to high state, causing switching of signal PR_MODE to 0, indicative of the circuit state, no more being programmed.

In the circuit in FIG. 10 it is supposed that signals ONEi and ALLi are generated by a suitable circuitry connected to a memory sensing network.

The advantages of the described method are evident from the above. In fact, the present method allows on one hand to have the desired programming accuracy by setting a threshold voltage increase with a suitable value, and on the other hand to avoid that the global programming time is made excessively long, since verifying is performed when at least one cell has reached the desired threshold level. The present method is particularly advantageously with a high number of levels to be programmed (for example from 16 on). A further reduction in the programming times is obtained according to the described solutions, according to which verifying is avoided at intermediate levels at which no cells have to be programmed and, for each die, the number of pulses is stored necessary to reach the condition in which linear relationship (1) is valid at the beginning of a global programming operation.

It is finally clear that numerous modifications and variations can be made to the method described and shown herein, all of which are within the inventive scope as defined in the enclosed claims. Particularly, to be prudent, the first verify step after a continues set of programming pulses can occur after the programming pulse preceding the one in which it is deemed that the cell or cells to be programmed have already reached the desired threshold voltage, in practice setting $B_i = N_i - 1$ in block 106 in FIG. 8 $B_i = INT(Ci-1)$ and in block 106' in FIG. 9.

What is claimed is:

1. A method for programming a plurality of non-volatile multi-level memory cells each having a gate terminal, comprising:

applying a set of programming pulses, wherein, upon every programming pulse, said gate terminal is supplied with a voltage whose value is increased with respect to the previous programming pulse;

cyclically applying a plurality of the programming pulses consecutively to the plurality of non-volatile memory cells in parallel without verifying the programming level of said cells;

performing a verify step to verify the level of programming of said cells after applying a plurality of consecutive programming pulses.

2. The method according to claim 1, wherein said plurality of pulses is equal to a nominal number of pulses necessary to take said cell from a current programming level to a following programming level.

3. The method according to claim 1, wherein, upon every programming pulse, said gate voltage shows a constant increase with respect to a previous programming pulse.

4. The method according to claim 3, wherein between a current programming pulse and a following programming pulse a threshold voltage difference is present, equal to a multiple, also not integer, of said constant increment, and in that said plurality of programming pulses is equal to an integer value obtained by truncating said multiple.

5. The method according to claim 4, wherein the threshold voltage steps between pairs of adjacent programming levels are of different values.

6. The method according to claim 1, wherein a first programming step starting from an erased state at a first programming level comprises a plurality of steps each including a programming step and a verify step.

7. The method according to claim 1, wherein said step of cyclically applying a plurality of consecutive programming pulses comprises:

detecting a first nominal number of programming pulses included between a current programming level and a following programming level;

calculating a number of programming pulses to be applied on the bias of said first nominal number of programming pulses supplying said number of programming pulses to be applied, without verify;

performing a verify step;

repeating the steps of supplying programming pulses and performing a verify step until at least one cell has reached the desired threshold value; and repeating the steps of supplying programming pulses and performing a verify step until all cells have reached a desired threshold level.

8. The method according to claim 7, wherein said cycle of steps is repeated to a maximum programming level.

9. The method according to claim 7, wherein said number of programming pulses to be applied is equal to said first nominal number of programming pulses.

10. The method according to claim 7, wherein said step of repeating further comprises a step of stopping supplying the programming pulses to those cells to be programmed that have already reached said desired threshold value.

11. The method according to claim 7, wherein said step of calculating comprises the steps of:

checking whether there are cells to be programmed at said following programming level;

if so, setting said number of programming pulses to be applied equal to an integer value obtained by truncating said first nominal number of programming pulses;

if not, increasing a current level index, calculating a second nominal number of programming pulses included between said current programming level and a programming level subsequent to said current programming level; summing said first and second nominal numbers of programming pulses; and repeating said steps of verifying whether there are cells to be programmed at said following programming level, increasing a current level index, computing a second nominal number of programming pulses and summing until it is verified that there is at least one cell to be programmed at said following programming level; finally, setting said number of programming pulses to be applied equal to an integer value obtained by truncating said second nominal number of programming pulses.

12. A method of global programming non-volatile, multi-level memory cells comprising:

applying a plurality of programming pulses to a selected plurality of memory cells without performing a verification of the threshold value programmed in the plurality of memory cells; and verifing the threshold values programmed into the memory cells after completing said plurality of programming pulses.

13. The method according to claim 12, wherein said plurality of programming pulses is equal to a nominal number of pulses required to change said memory cell from a current memory level to a following memory level.

14. The method according to claim 13, wherein said current memory level and said following memory level are contiguous.

15. The method according to claim 13, wherein a value of change in the memory cell effected by one of said plurality of programming pulses is less than the margin between a minimum threshold value and a maximum threshold value of said following memory level.

16. The method according to claim 15, wherein said nominal number is the product of the difference between the maximum threshold value of said current memory level and the minimum threshold value of said following memory level divided by said value of change, truncated to the nearest integer.

17. The method according to claim 16, wherein said verify step is executed following said nominal number of pulses.

18. The method according to claim 17, wherein if the actual value of said memory cell is outside said minimum threshold level and said maximum threshold of said following memory level, an additional pulse is executed followed by an additional verify step.

19. A method of programming a plurality of multi-level memory cells in a repeated sequence of steps comprising:

detecting a first nominal number of programming pulses included between a current programming level and a following programming level;

calculating a number of programming pulses to be applied on the bias of said first nominal number of programming pulses supplying said number of programming pulses to be applied in parallel to the plurality of memory cells, without verify;

performing a verify step;

repeating the steps of supplying a programming pulse and performing a verify step until at least one cell of the plurality of cells has reached the desired threshold value; and repeating the steps of supplying a programming step and performing a verify step until the plurality of cells has reached a desired threshold level.

* * * * *